United States Patent [19]

Heffner

[11] Patent Number: 4,629,906
[45] Date of Patent: Dec. 16, 1986

[54] BIAS SHARING AN ELECTRONIC SWITCH AND AN ACTIVE DEVICE

[75] Inventor: Samuel T. Heffner, Hurst, Tex.
[73] Assignee: Motorola, Inc., Schaumburg, Ill.
[21] Appl. No.: 730,896
[22] Filed: May 6, 1985
[51] Int. Cl.⁴ .............................................. H02J 5/00
[52] U.S. Cl. .................................. 307/80; 307/43; 331/177 R; 331/179
[58] Field of Search .................. 307/43, 80; 323/349, 323/351; 331/40, 177 R, 179

[56] References Cited

U.S. PATENT DOCUMENTS

| | | | |
|---|---|---|---|
| 2,930,991 | 3/1960 | Edwards | 331/179 X |
| 3,295,070 | 12/1966 | Tewksbury et al. | 331/179 |
| 3,416,100 | 12/1968 | Kruse et al. | 331/108 R |
| 3,562,597 | 2/1971 | Winston | 361/156 |
| 3,633,128 | 1/1972 | Sevilla | 331/177 R X |

FOREIGN PATENT DOCUMENTS 58-181338 10/1983 Japan .................................. 331/179
WO82/03509 10/1982 PCT Int'l Appl.

OTHER PUBLICATIONS

Motorola Service Manual, 68P81044E40 PEPS306-06—7/20/80.

Primary Examiner—William M. Shoop, Jr.
Assistant Examiner—Bentsu Ro
Attorney, Agent, or Firm—Robert J. Crawford; Donald B. Southard

[57] ABSTRACT

In radio frequency applications where energy is coupled between an oscillator device and a reactive load to alter the frequency of the energy at the device, or if coupling of the energy is selectively provided to a plurality of outputs, a PIN diode can be used to electrically switch the coupling of this energy. A significant reduction in current drain can be gotten by using the PIN diode in series with the active device which is amplifying the energy. A current source is used for forward biasing the PIN diode. The same forward bias current is used to bias the active device, saving an additional bias current for the active device. Biasing of the active device, while the PIN diode is reverse biased, is accomplished by an alternate current supply source. Control of each current supply device yields an inverse switching function to selectively couple energy at the active device. When the PIN diode is forward biased, the energy at the active device is coupled to the output or to the reactive load, which alters the frequency of the energy.

13 Claims, 8 Drawing Figures

BIAS SHARING AN ELECTRONIC SWITCH AND AN ACTIVE DEVICE

FIELD OF THE INVENTION

The present invention relates to power conservation, and more particularly, to an arrangement for conserving power by bias sharing an electronic switch and an active device in radio frequency applications.

DESCRIPTION OF THE PRIOR ART

There are many applications where it is necessary to selectively couple the energy at an active device to a terminal set, i.e. external circuitry with a common ground, through an electronic switch. One such application is in altering the frequency of the energy at an active device, such as an oscillator, by coupling a reactive load onto the oscillator.

Known configurations in frequency altering of this type include biasing the oscillator separately from the electronic switch. The reactive load alters the operating frequency of the oscillator through a coupling device such as a transmission line or a reactive network. An electronic switch, such as a PIN diode, is used to selectively couple the reactive load onto the oscillator. When the PIN diode is reversed biased, its high impedance is used to isolate the reactive load from affecting the oscillator. All known variations of this configuration forward bias the PIN diode separately from the biasing required at the oscillator.

The disadvantage to this technique is that the bias current required at the oscillator is quite significant as is the current required to forward bias the PIN diode. Often several milliamps of current are required to bias each. In applications where power minimization is desirable, such as portable radios, heat sensitive designs and switching power circuits, there is a need to minimize this significant current drain.

Another application of switching RF energy is in selectively coupling or switching the energy at an active device, such as an amplifier, to the transmitter or the receiver circuitry in a radio.

Several techniques for providing this type of switching are known. One such system employs a pair of magnetically operated reed switches, one of which is 'closed' for connecting the RF energy to the receiver circuitry, while the other being 'open', disconnects the RF energy from the transmitter section. Inverse operation of the switches provides for selective coupling but lacks in providing for clean, smooth connections as the selective coupling takes place. Other disadvantages of this type of switching are: the bulkiness of the relays, their high cost, their fragility and corresponding lack of reliability.

An improvement over the relay in this type of application is the use of a PIN diode controlled similar to the relay. The PIN diode is an electronic switch which is 'closed' and 'open' as described above, but is controlled by a bias current. A substantial amount of current is needed to forward bias the diode, and a lesser amount to reverse bias the diode.

In known configurations, the amplifier is coupled to the switch circuitry through a D.C. blocking network, such as a capacitor. This prevents any bias current through the PIN diode from being shared with the active device. The amplifier and the PIN diode are both biased by RF chokes, allowing D.C. current to bias the amplifier and the PIN diode without RF shorting the desired energy. The result of separately biasing the active device, i.e. the amplifier, and the PIN diode is the excessive current drain as previously discussed.

As aforementioned, in areas where power conservation is desirable, an improvement is needed to minimize the amount of current consumed. A special application may be to package this switching arrangement in an integrated circuit. It is obvious that the relays could not be considered in an IC implementation, but any configuration of the prior art would not be desirable in an IC package since the excessive biasing requirements would create a significant heat problem within the IC.

SUMMARY OF THE INVENTION

An object of the present invention is to provide a power conserving circuit arrangement for selectively coupling energy at an active device to a terminal set intended to satisfy the aforementioned needs.

Another object of the present invention is to provide a circuit of reduced cost, a circuit with fewer elements, a circuit using less space and dissipating less heat.

The invention embodies a unique system employing an electronic switch allowing for the energy at the active device to be selectively coupled to a terminal set, which can then be used to selectively couple the energy to a plurality of outputs or to alter the frequency of the energy at the active device. A PIN diode is utilizable as the electronic switch which is selectively activated by control via a first and second current supply. This allows the active device to be biased by the same current that biases the electronic switch, thereby substantially reducing the bias current of any prior known configuration.

DETAILED DESCRIPTION OF THE PREFERRED EMBODIMENTS

Figure 1:
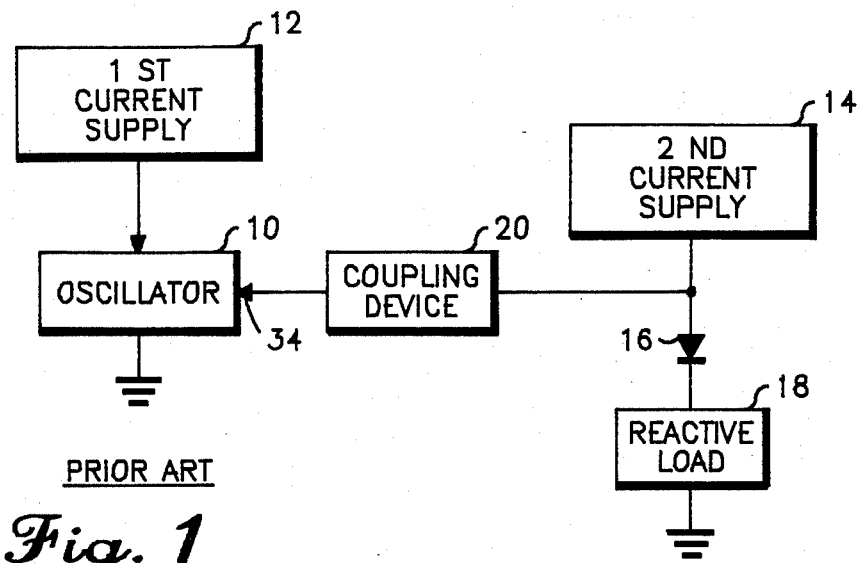
FIG. 1 is a block diagram of a typically known configuration in which the frequency at an oscillator is altered.

Referring now to the drawings, and more particularly to FIG. 1, there is shown a block diagram of a typical prior art configuration directed to altering the frequency of an oscillator 10. A first current supply 12 supplies the necessary current to bias the oscillator 10. A second current supply 14 supplies the necessary current for forward biasing the PIN diode 16, causing the PIN diode 16 to appear as a short and thereby enabling the reactive load 18 to alter the frequency of the oscillator 10 through a coupling device 20. The PIN diode 16 is reverse biased by the second current supply 14 with bias current flowing in the reverse direction. This causes the PIN diode 16 to function in a high impedance mode which disables any effect the reactive load 18 may have on the frequency of the oscillator 10. It will be noted that when the PIN diode 16 is forward biased, two bias currents are active.

Figure 2:
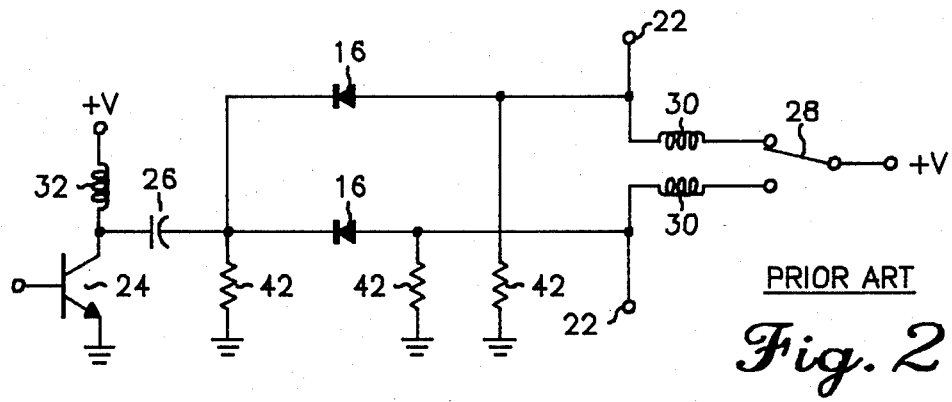
FIG. 2 is a block diagram of a typically known configuration in which RF energy is selectively coupled between two outputs.

FIG. 2 shows a prior art circuit arrangement which is configured to switch RF energy to one of two outputs 22. RF energy is amplified through an amplifier 24, coupled through a blocking capacitor 26 to one of the outputs 22. The respective PIN diodes 16 act as electronic switch means to either isolate the RF energy from, or to pass the RF energy to, one of the outputs 22. These actions are controlled by a control device 28. Biasing of the PIN diodes 16 is accomplished by crrent flowing through the RF chokes 30. Current flowing through one of the RF chokes 30 causes the corresponding PIN diode 16 to become forward biased thereby appearing as a short, enabling the RF energy at the amplifier 24 to pass through to the respective output 22. Current in one of the RF chokes 30 becoming deactivated causes the respective PIN diode 16 to become reverse biased, provided current through the other PIN diode is active, which disables the RF energy at the amplifier 24 from passing through to the respective output 22. The amplifier 24 is DC biased by the current supplied through its RF choke 32, not through the PIN diode 16.

The same situation is seen in this configuration as the one shown in FIG. 1. Current is needed to bias the active device separately from the current needed to selectively forward bias the PIN diode, creating an excessive current drain.

Figure 3:
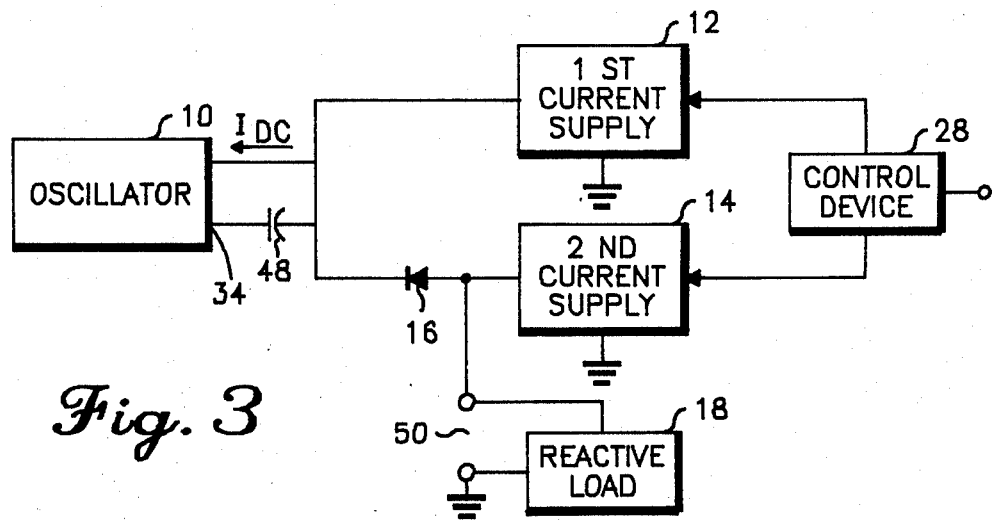
FIG. 3 is a block diagram of an oscillator implementation which has been constructed in accordance with the present invention.

FIG. 3 shows a circuit arrangement which is in accordance with the present invention for altering the frequency of an oscillator. The PIN diode 16 is configured in series with the current path needed to bias the oscillator 10. The first and second current supplies 12 and 14 are controlled by a control device 28. To apply forward bias current through the PIN diode 16, the second current supply 14 is actuated, and the first current supply 12 is deactuated. This causes the reactive load 18 to alter the frequency of the oscillator 10 through the coupling device 48.

A tap point 34 is supplied at the oscillator 10 enabling a proper path for the reactive load 18 to couple with the energy at the oscillator 10, through a bypass capacitor 48. To disable the affect of the reactive load 18, the first current supply 12 is actuated and the second current supply 14 is deactuated. This causes the PIN diode 16 to become reverse biased creating a high impedance effect, thereby blocking the reactive load 18 from coupling with the energy at the oscillator 10.

Accordingly, it will be noted that when the PIN diode 16 is forward biased by current as supplied by the second current supply 14, the same current biases the oscillator 10. This shared biasing creates significant reduction in current drain not realized in the prior art.

Figure 4:
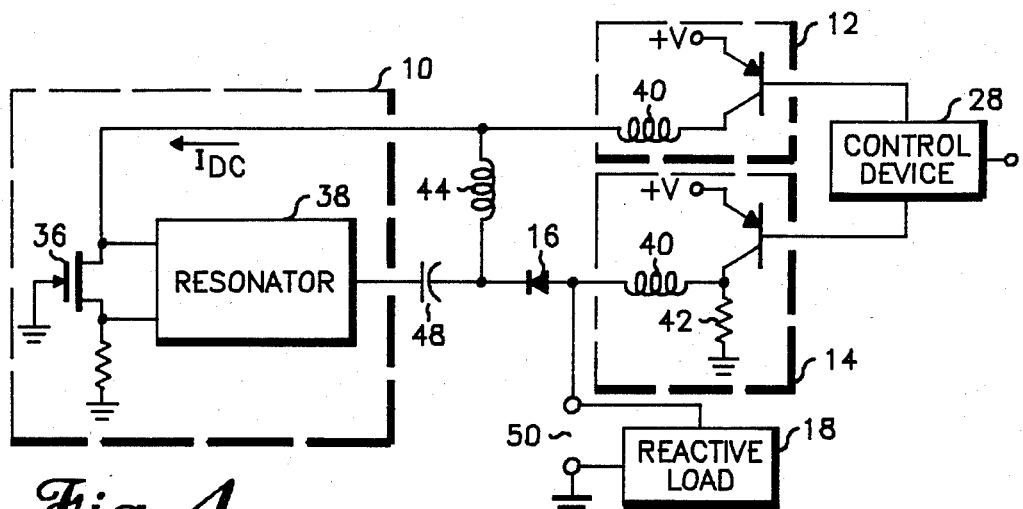
FIG. 4 is a schematic diagram of the oscillator implementation of FIG. 3 which includes a FET and a resonator.

FIG. 4 shows the detailed schematic of the circuitry from FIG. 3. The oscillator 10 of FIG. 3 is represented by its component parts, including a FET 36 and a resonator 38. Also included with the oscillator 10 is an RF choke 44, which provides isolation to the second current supply 14. The bypass capacitor 48 provides tne path for coupling the energy at the oscillator 10 with the reactive load 18 located adjacent the terminal set 50. Current supplies 12 and 14 are shown to include transistors. RF chokes 40 are also included which provide RF isolation to the current supplies 12 and 14. A terminating resistor 42 is included in the second current supply 14 which allows for proper reverse biasing of the PIN diode 16 when the first current supply 12 is on and the second current supply 14 is off. The control device 28 is shown in block form. Its funtion is to inversely control the actuation of the current supplies 12 and 14. This provides only one current supply 12 or 14 supplying current to the oscillator 10, yielding the significant power savings aforementioned.

Figure 5:
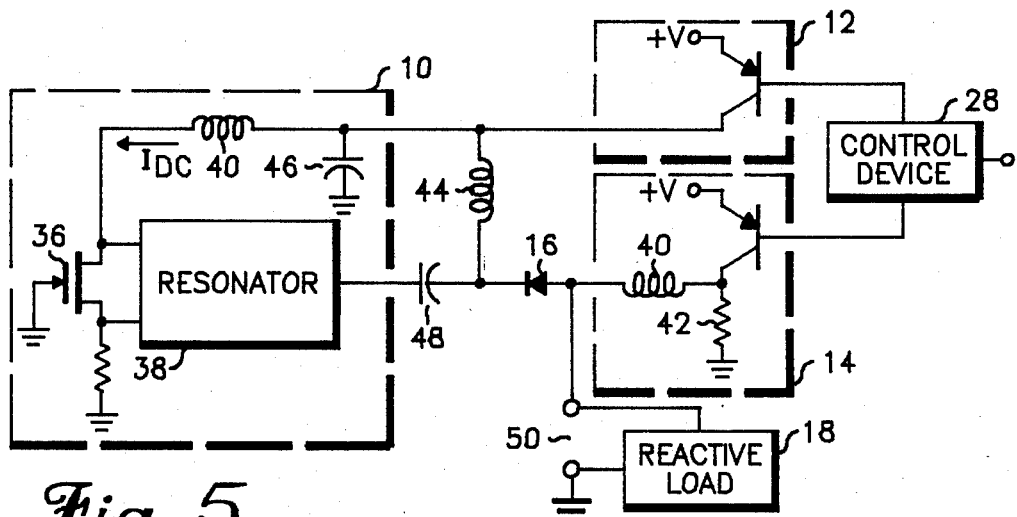
FIG. 5 is a slight circuit variation to FIG. 4.

FIG. 5 shows a preferred, alternate configuration to that shown in FIG. 4. This variation to FIG. 4 consists of the RF choke 40 of the first current supply 12 relocated to the oscillator 10, and a bypass capacitor 46 also included in the oscillator 10. The advantage of this arrangement is that the bypass capacitor 46 terminates any excess RF energy which can leak from the resonator 38.

Figure 6:
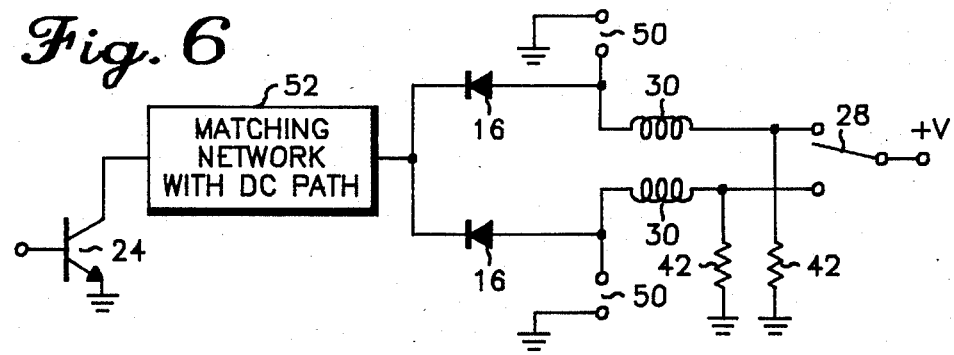
FIG. 6 is a circuit arrangement of the present invention for switching RF energy to a pair of outputs.

FIG. 6 shows a preferred embodiment of the present invention applicable to switching energy at an active device, which results in a substantial reduction in current drain as compared to those circuits known to the art. Blocking capacitor 26 and the RF choke 32, of FIG. 2, are not required. Biasing of the amplifier 24 is accomplished as in the oscillator application, i.e. through the current that selectively forward biases PIN diodes 16. Since the blocking capacitor is now replaced by an optional matching network with a DC current path 52, a DC current path to the amplifier is maintained as long as one of the PIN diodes 16 are forward biased. The matching network 52 is used to properly couple the RF energy with a selected terminal set 50. As mentioned in the description of FIG. 2, by forward biasing a PIN diode 16, the output at the corresponding terminal set 50 is coupled with the RF energy amplified through the amplifier 24. Note also that, as previously mentioned in regard to FIG. 3, a significant reduction in current drain is realized through sharing the biasing current required by the selected PIN diode and the active device.

Figure 7:
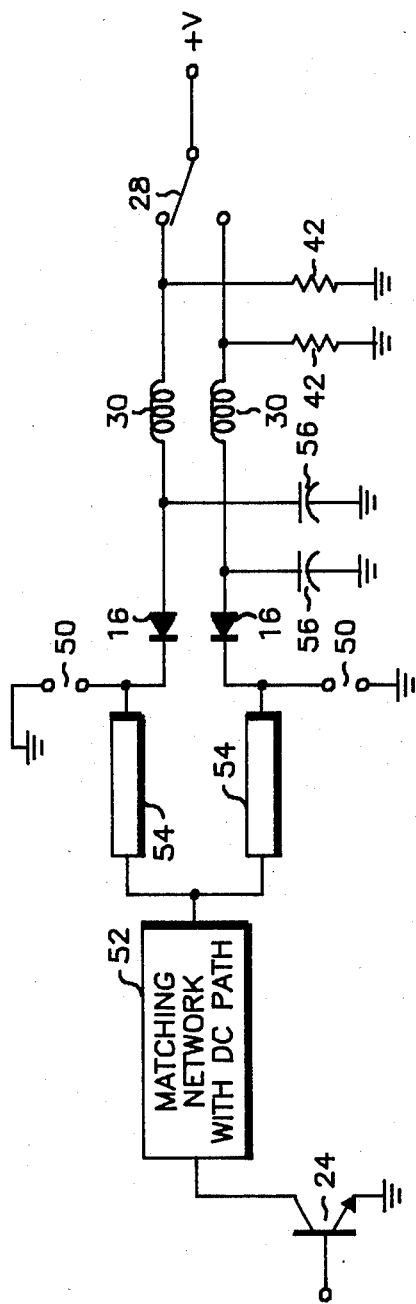
FIG. 7 is an alternate embodiment to FIG. 6.

FIG. 7 is intended as an alternate configuration to that shown in FIG. 6. This configuration uses 1/4 wave transmission lines 54 and bypass capacitors 56 coupled to the PIN diodes 16. The impedance seen by the amplifier 24 approaches infinity when its corresponding PIN diode 16 is forward biased. The corresponding bypass capacitor 56 appears as a short at the PIN diode 16 end of the transmission line 54. Accordingly, the output at the terminal set 50, coupled to the same PIN diode 16, is not connected to the energy at the amplifier 24 because of the high impedance seen at its transmission line 54. Amplifier 24 is only connected to a desired terminal set 50 when the associated PIN diode 16 is reverse biased. This is opposite the case described in FIG. 6. FIG. 6 shows the terminal set 50 connected to the amplifier 24 when the PIN diode 12 is forward biased, not reverse biased.

Figure 8:
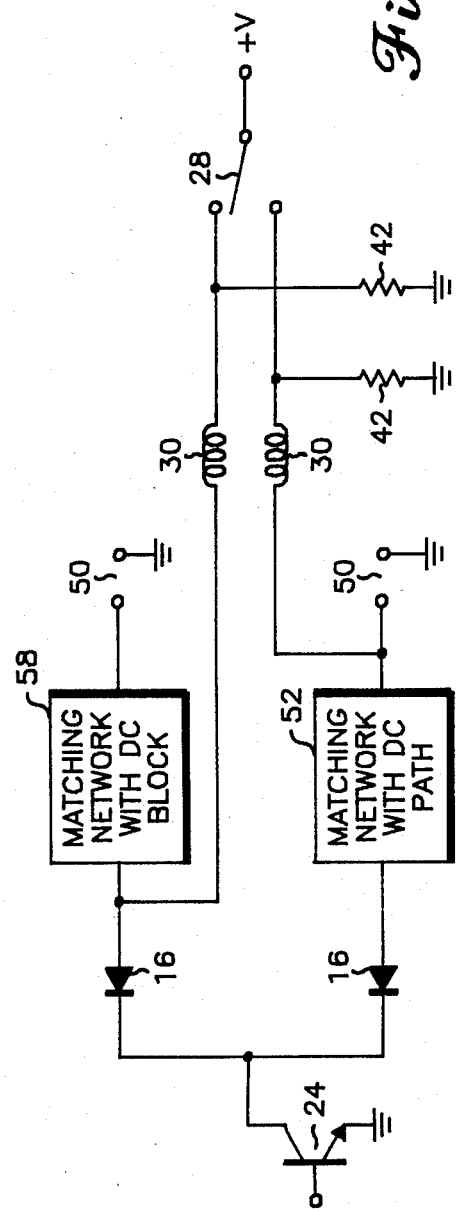
FIG. 8 is another alternate embodiment to FIG. 6.

FIG. 8 is still another alternate embodiment to that shown in FIG. 6. In this case two matching networks 58 and 52 are shown located adjacent the respective terminal sets 50. Matching network 58 does not have a DC path, but rather a DC block. Matching network 52 has a DC path which allows the bias current to pass through. Current is supplied to the amplifier 24 through the associated PIN diode 16. An advantage of this type of configuration is that the matching networks can differ, yielding alternate matches at the associated terminal set 50. Additionally, this configuration shows the implementation of a matching network without the requirement of having a DC path.

In this manner, significant power reduction is realized by sharing the forward bias current of the associated PIN diode with the bias current required at the active device. Additionally, fewer components are used, cost is reduced, less space is required and less heat is dissipated.

What is claimed is:

1. A circuit arrangement for selectively coupling energy at an active device to a terminal set comprising:
   (a) electronic switch means coupled to the active device;
   (b) means for coupling the terminal set to said electronic switch means;
   (c) first current supply means for supplying DC current to the active device;
   (d) second current supply means for supplying DC current to the active device through said electronic switch means to cause the energy at the active device to be connected to the terminal set and to DC bias both the active device and said electronic switch means; and
   (e) control means for selectively actuating said first and second current supply means.

2. A circuit arrangement for selectively coupling energy as claimed in claim 1, wherein said second current supply means includes termination means for terminating the DC current biasing said electronic switch means.

3. A circuit arrangement for selectively coupling energy as claimed in claim 1, wherein said electronic switch means comprises a PIN diode.

4. A method for selectively coupling energy at an active device to a terminal set comprising:
   (a) coupling the terminal set to the active device through an electronic switch means;
   (b) supplying DC current by a first current supply means to the active device;
   (c) supplying DC current by a second current supply means to the active device through said electronic switch means to cause the energy at the active device to be connected to the terminal set and to DC bias both the active device and said electronic switch means; and
   (d) selectively actuating said first and second current supply means.

5. A method for selectively coupling energy as claimed in claim 4, wherein supplying current by said first and second current supply means further includes:
   terminating the DC current biasing said electronic switch means.

6. A method for selectively coupling energy as claimed in claim 4, wherein said electronic switch means further includes a PIN diode.

7. A circuit arrangement for selectively altering the frequency of the energy at an active device comprising:
   (a) electronic switch means coupled to the active device;
   (b) a reactive load coupled to said electronic switch means;
   (c) first current supply means for supplying DC current to the active device;
   (d) second current supply means for supplying DC current to the active device through said electronic switch means to DC bias both the active device and said electronic switch means and to cause the energy at the active device to be connected to said reactive load, thereby altering the frequency of the energy at the active device; and
   (e) control means for selectively actuating said first and second current supply means.

8. A circuit arrangement for selectively altering the frequency of the energy at an active device according to claim 7, wherein said second current supply means includes terminating means for terminating the DC current biasing said electronic switch means.

9. A circuit arrangement for selectively altering the frequency of the energy at an active device according to claim 7, wherein said electronic switch means further includes a PIN diode.

10. A circuit arrangement for coupling the energy at an active device to a selected one of a plurality of outputs including:
    (a) an electronic switch for coupling the active device to each of said plurality of ouputs;
    (b) current supply means for supplying DC current to the active device through said electronic switch means to cause the energy at the active device to be connected to said selected one of said outputs and to DC bias both the active device and said electronic switch means; and
    (c) control means for controlling the DC current supplied to the active device through said electronic switch means.

11. A circuit arrangement for selectively coupling energy according to claim 10 further including one or more matching networks coupled to the active device.

12. A circuit arrangement for selectively coupling energy according to claim 10, further including a ¼ wave transmission line.

13. A circuit arrangement for selectively coupling energy according to claim 10, wherein said electronic switch means further includes a PIN diode.

* * * * *